(12) United States Patent
Buck

(10) Patent No.: US 6,366,110 B1
(45) Date of Patent: Apr. 2, 2002

(54) CONFIGURATION FOR TESTING CHIPS

(75) Inventor: Martin Buck, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/353,612

(22) Filed: Jul. 14, 1999

(30) Foreign Application Priority Data

Jul. 14, 1998 (DE) .......................................... 198 31 563

(51) Int. Cl.⁷ ................................................ G01R 31/26
(52) U.S. Cl. ....................................................... 324/765
(58) Field of Search ................................ 324/765, 754, 324/758, 759, 761, 158.1

(56) References Cited

U.S. PATENT DOCUMENTS 5,047,711 A   9/1991  Smith et al.
5,239,191 A   8/1993  Sakumoto et al.
5,539,325 A * 7/1996  Rostoker et al. ............ 324/765

FOREIGN PATENT DOCUMENTS

EP    0427328 A2   5/1991

* cited by examiner

Primary Examiner—Safet Metjahic
Assistant Examiner—J. Kerveros
(74) Attorney, Agent, or Firm—Herbert L. Lerner; Laurence A. Greenberg; Werner H. Stemer

(57) ABSTRACT

A configuration is provided for testing chips produced from a wafer. The chips are supplied with test signals through the use of a test head. The test signals can be applied in a serial or parallel manner to the chips which are actually in the wafer, through the use of test lines provided in a sawing edge of the chips.

2 Claims, 1 Drawing Sheet

CONFIGURATION FOR TESTING CHIPS

BACKGROUND OF THE INVENTION

Field of the Invention

The present invention relates to a configuration for testing chips produced from a wafer, in which the chips are supplied with test signals through the use of a test head, and evaluation of the test signals makes it possible to ascertain whether or not a respective chip satisfies predetermined requirements.

As is known, chips must be subjected to numerous tests before being delivered to users. The tests ascertain whether or not a respective chip, or more precisely an integrated circuit provided in the respective chip, such as a memory circuit, satisfies predetermined requirements. Ever increasing integration levels or storage densities mean that the time required for the tests (test time) is becoming longer and longer, which also causes test costs to rise to an unacceptable extent.

In order to remedy that situation, it has already been thought of to no longer test the chips individually, but instead to test a plurality of chips in parallel and to additionally employ data compression in the process. That would enable the test time to be reduced by a not inconsiderable extent. The disadvantage, however, would be that such parallel testing would require a correspondingly large number of tester channels leading from the respective chips that are in parallel with one another to the test head. That would render such a procedure complicated, with the result that it has not been introduced in practice heretofore.

SUMMARY OF THE INVENTION

It is accordingly an object of the invention to provide a configuration for testing chips, which overcomes the hereinafore-mentioned disadvantages of the heretofore-known devices of this general type and which enables a test time for the chips to be considerably reduced without major additional outlay.

With the foregoing and other objects in view there is provided, in accordance with the invention, a test configuration, comprising a wafer having chips to be tested; the chips having sawing edges and test lines disposed in the sawing edges; a test head connected to the test lines for supplying the chips one after the other with test signals to be evaluated for ascertaining if a respective one of the chips satisfies predetermined requirements; and a dedicated chip select line for selecting one of the chips to be currently tested.

One of the test lines laid in the sawing edge can be used in each case for this chip select line, with each chip being assigned a chip select line.

With the objects of the invention in view, there is also provided a test configuration, comprising a wafer having chips to be tested; the chips having sawing edges, test lines disposed in the sawing edges and data inputs and data outputs in the sawing edges; a test head connected to the test lines for supplying a plurality of the chips in parallel, behaving like a module, with test signals to be evaluated for ascertaining if a respective one of the chips satisfies predetermined requirements; and logic units disposed at the data inputs and data outputs for data compression.

Therefore, in the configuration according to the invention, the testing of the as yet unseparated chips is actually performed at the wafer level, with the test lines being laid in the sawing edge (kerf), where they are destroyed after the conclusion of the test when the chips are sawn from the wafer.

Other features which are considered as characteristic for the invention are set forth in the appended claims.

Although the invention is illustrated and described herein as embodied in a configuration for testing chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
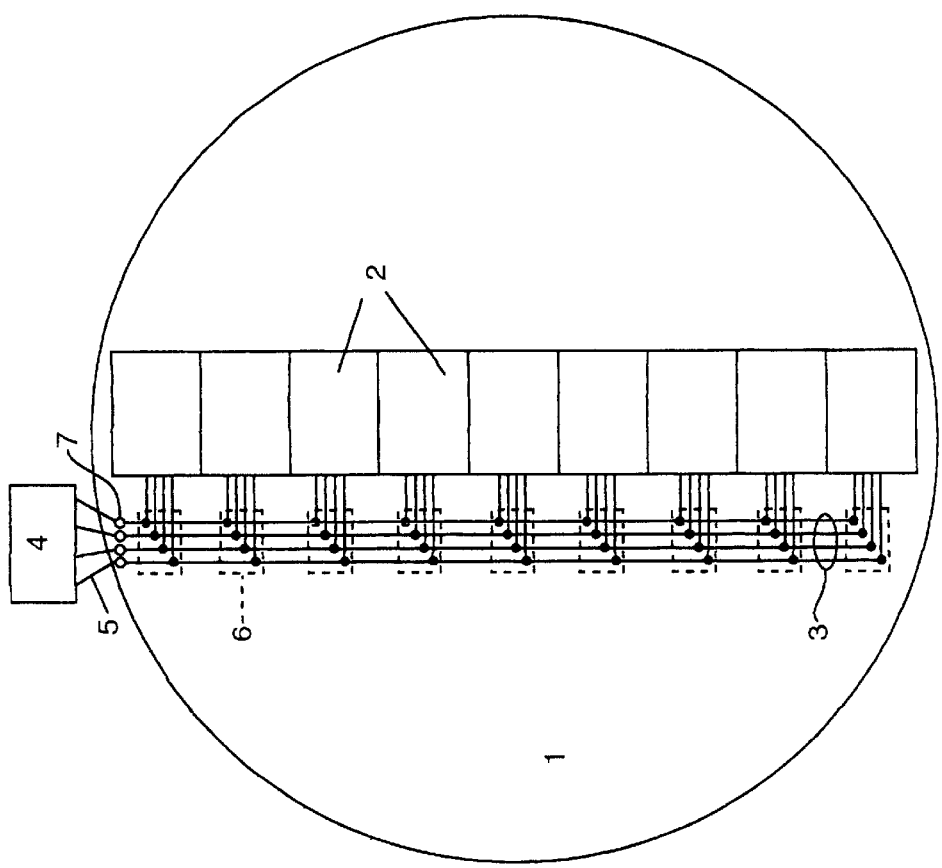
FIG. 1 is a diagrammatic, plan view of a configuration according to the invention for explaining first and second exemplary embodiments of the invention.

Referring now to the figures of the drawings in detail and first, particularly, to FIG. 1 thereof, there is seen a plan view of a semiconductor wafer 1, which is composed of silicon, for example, and in which a multiplicity of chips 2 are provided. These chips 2 are connected to test lines 3, each of which ends at contacts 7 that can be contact-connected to needles 5 of a test head 4. Only four test lines 3 are illustrated in FIG. 1. In actual fact, however, there are a multiplicity of such test lines 3. A chip select line is also assigned to each of these chips 2 in accordance with a first exemplary embodiment. The chip select line is illustrated as part of the test lines 3.

Figure 2:
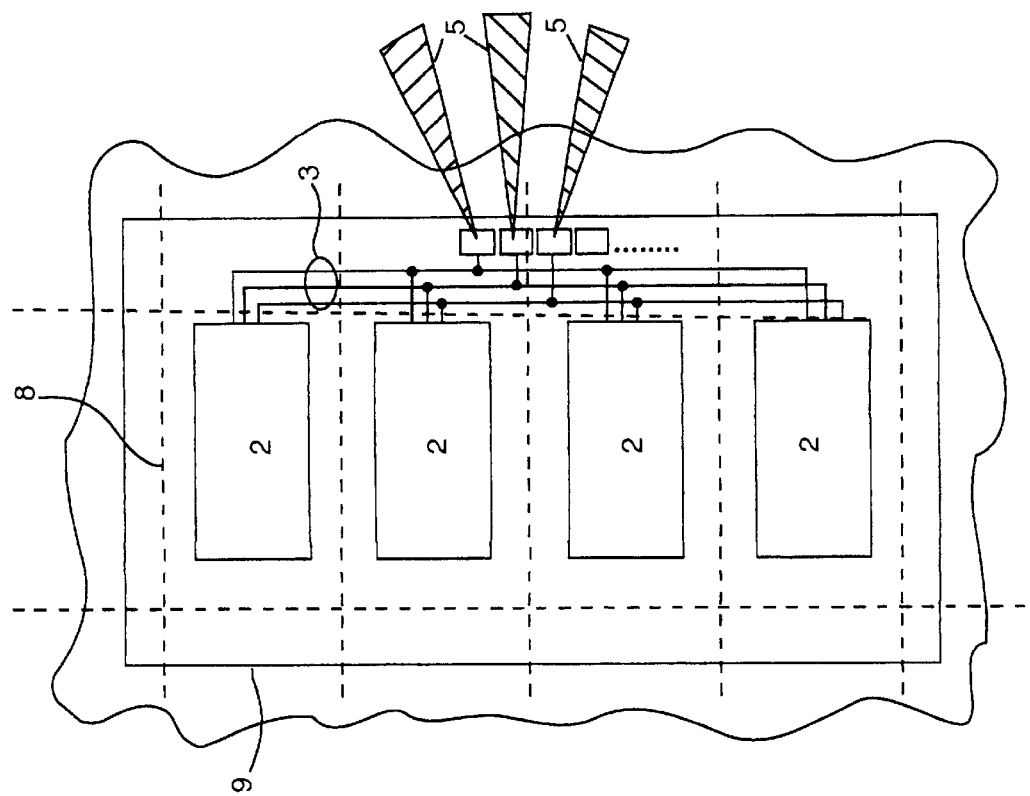
FIG. 2 is a fragmentary plan view of a plurality of chips with a sawing edge in accordance with the first and second exemplary embodiments of the invention.

In this first exemplary embodiment, the chips 2 are tested one after the other, with the respective chip to be tested being driven through the use of the chip select lines. What is essential about this first exemplary embodiment is the fact that the chips 2 are tested on the wafer 1. In that case, as is shown in FIG. 2 with a somewhat different configuration of the contacts 7, the test lines 3 are routed in a sawing edge (kerf) 9 with a center separating line 8. After the wafer 1 has been resolved into the individual chips 2, the test lines 3 which, after all, are then no longer required, are thus separated off.

In a second exemplary embodiment of the invention, a plurality of chips 2, for example four chips 2 as is shown in FIG. 2, are connected in parallel and are contact-connected to the needles 5, also in parallel.

These chips 2 that are connected in parallel therefore behave like a module, about which it is ascertained whether or not it satisfies the requirements which are imposed. In order to provide parallel testing, data compression with the aid of logic units 6 assigned to the respective chips 2 may additionally be performed in order further to reduce the test time. These logic units 6 are also preferably provided in the sawing edge 9, in a manner which is not illustrated in FIG. 2.

The invention makes it possible, especially with the second exemplary embodiment, to considerably reduce the test time and therefore the test costs as well. Testing at the wafer level, which is also performed in the first exemplary embodiment, is particularly advantageous since the additional outlay for the test lines 3 (including chip select lines) is relatively low. Above all, it is advantageous that testing of the separated chips, which is significantly more laborious, can be obviated.

I claim:

1. A test configuration, comprising:

a wafer having chips to be tested;

said chips having sawing edges and test lines disposed in said sawing edges;

a test head having needles connected to said test lines for supplying said chips one after the other with test signals to be evaluated for ascertaining if a respective one of said chips satisfies predetermined requirements; and a chip select line for selecting one of said chips to be currently tested.

2. A test configuration, comprising:

a wafer having chips to be tested;

said chips having sawing edges, test lines disposed in said sawing edges and data inputs and data outputs in said sawing edges;

a test head having needles connected to said test lines for supplying a plurality of said chips in parallel with test signals to be evaluated for ascertaining if a respective one of said chips satisfies predetermined requirements, said plurality of said chips defining a module; and logic units disposed at said data inputs and data outputs for data compression.

* * * * *